United States Patent [19]

Nakajima et al.

[11] Patent Number: 5,574,402
[45] Date of Patent: Nov. 12, 1996

[54] MONOLITHIC INTEGRATED CIRCUIT DEVICE HAVING MICROWAVE POWER AMPLIFIER INCLUDING A MATCHING CIRCUIT USING DISTRIBUTED LINES

[75] Inventors: Akishige Nakajima; Tooru Fujioka, both of Kokubunji; Eiichi Hase, Iruma, all of Japan

[73] Assignee: Hitachi, Ltd., Tokyo, Japan

[21] Appl. No.: 524,188

[22] Filed: Sep. 6, 1995

[30] Foreign Application Priority Data

Sep. 16, 1994 [JP] Japan .................................. 6-221369

[51] Int. Cl.$^6$ ............................ H03F 3/193; H03F 3/195
[52] U.S. Cl. ............................ 330/277; 330/286; 330/307
[58] Field of Search ................................. 330/277, 286, 330/307

[56] References Cited

U.S. PATENT DOCUMENTS 4,771,247  9/1988  Jacomb-Hood .................... 330/286 X

OTHER PUBLICATIONS

The Technical Report of IEIC, May 29, 1984, pp. 1–7.
1994 Spring Meeting C–110 of IEIC, p. 2–615.
1994 Spring Meeting C–107 of IEIC, p. 2–612.

Primary Examiner—James B. Mullins
Attorney, Agent, or Firm—Fay, Sharpe, Beall, Fagan, Minnich & McKee

[57] ABSTRACT

A microwave multi-stage power amplifier has matching circuits for input and output stages and one or more interstage matching circuits. The amplifier and a signal output pad and first and second voltage supply pads are formed at one and the same semi-insulating substrate. A first FET in the output stage has its drain connected to the first voltage supply pad through a first distributed line and further connected to the signal output pad through a second distributed line in which the first and second distributed lines contribute to formation of the matching circuit for the output stage. A second FET in a stage preceding to the output stage has its drain connected to the second voltage supply pad through a third distributed line serving as a connection conductor. The first distributed line has a width larger than that of the third distributed line and has a length which limits an impedance seen at the drain of the output stage FET towards the first voltage supply pad at an operation frequency of the amplifier to a value other than infinity.

5 Claims, 3 Drawing Sheets

MONOLITHIC INTEGRATED CIRCUIT DEVICE HAVING MICROWAVE POWER AMPLIFIER INCLUDING A MATCHING CIRCUIT USING DISTRIBUTED LINES

BACKGROUND OF THE INVENTION

The present invention relates to semiconductor devices operative in a relatively low frequency range such as 1 to 3 GHz for the mobile communication, and more particularly to a circuit arrangement suitable for implementation in the form of a microwave monolithic integrated circuit device including a high performance power amplifier for a sending unit of a mobile terminal which has an FET having a large gate width.

In order to reduce a mobile communication terminal in size, in addition to reduction of a battery and a signal processing LSI included in the terminal, it will be necessary to reduce function devices used in a radio unit (sending/receiving unit), such as a power amplifier, a low noise amplifier, a frequency converter, and a bandpass filter.

Each of these function devices unavoidably involves matching circuits at the I/O stages for higher performance of the radio unit of the mobile communication terminal. In order to reduce the radio unit in size, the circuit components of the matching circuit efforts have bee made such that a leadless resistor, a leadless capacitor and a leadless inductor are made smaller, highly packaged and formed on a multi-layered wiring substrate. For further size reduction, it will be a technical trend that the matching circuits used are implemented in a microwave monolithic integrated circuit in which some parts of the matching circuit such as active elements (FETs) are formed on a semiconductor substrate.

A matching circuit to be formed in a microwave monolithic IC device includes thin film capacitors, spiral inductors, and distributed lines. Among them, the spiral inductors and the distributed lines will occupy a large area. In developing microwave monolithic IC devices, efforts have been concentrated to how to use properly these main components from the viewpoint of the high performance, operation frequency and occupation area and size reduction.

The power amplifier needs an FET having a large gate width for obtaining a large output power. As the gate width is made larger, the output impedance of the FET is made lower accordingly. Hence, even a slight resistance appearing in the signal propagating direction may lower a power gain.

Thus, for a high operation performance of the spiral inductor in the matching circuit, it is desirable to reduce a series parasitic resistance appearing in the signal propagating direction. For this purpose, it is necessary to widen the conductor for forming the spiral inductor. To obtain an intended inductance from such a conductor, outer dimensions of the inductor will be larger.

In realizing an intended impedance with a spiral inductor or a distributed line, as the operation frequency is made higher, outer dimensions of the spiral inductor and the line length of the distributed line may be made smaller. However, the line length of the distributed line has a greater dependency on the operation frequency than that of the outer dimension of the spiral inductor. In order to obtain the same impedance at a low frequency such as 1 to 3 GHz, the line length of the distributed line will have to be made abruptly longer.

On the other hand, the spiral inductor unavoidably provides a parasitic capacity such as an inter-line capacity and an earth capacity in light of its structure. Hence, the use of the spiral inductor is limited to operation frequencies lower than its resonant frequency. Thus, it is not used at high frequencies such 5 to 10 GHz.

As described above, in arranging the circuit, the spiral inductors and the distributed lines are required to be properly used by considering the operation frequency range and the allowable occupation area of the function device of the radio unit.

As reported in the Technical Report SAT 84-1 of the Institute of Electronics, Information and Communication Engineers of Japan (IEIC) published on May 29, 1984, pp. 1–7, the power amplifier used for a super high frequency band of 10 to 30 GHz does not employ the spiral inductor because the spiral inductor has a resonance frequency lower than 10 GHz. Hence, the power amplifier is realized in a microwave monolithic IC device formed on a single chip in which matching circuits for the input and the output stages are both made of distributed lines.

However, for a relatively low operation frequency such as 1 to 3 GHz, if the power amplifier employs only distributed lines, the distributed line would have a relatively long line length, which results in a large chip area. In this case, since this frequency band is lower than the resonant frequency of a spiral inductance of a lumped constant, the spiral inductor may be employed in the power amplifier. As described in page 2-615 of 1994 Spring Meeting C-110 of IEIC, therefore, the power amplifier employs a circuit arrangement in which the spiral inductors and the distributed lines are mingled. The matching circuit for an input stage and the inter-stage matching circuit use spiral inductors. Between a drain electrode of the final-stage FET and an output signal terminal provided in the output matching circuit for the final stage, a distributed line is formed so that a series parasitic resistance towards the signal propagation, which will undesirably lower the electric power gain, may be relatively easily reduced by widening the distributed line. With the conventional design method, the overall length of the distributed line for supplying a drain voltage for the final stage FET is made to be a quarter of a wavelength λ of the effective wavelength of the operation frequency, because an impedance seen at the drain electrode towards the power supply is infinity for thereby preventing leakage of an output signal to the power supply. When the operation frequency is 1.9 GHz, a line length of λ/4 is as long as about 11 mm. Such a long distributed line is not allowed to be formed on one and the same substrate. Further, the length is too large for the distributed line even to be attached to the outside of the substrate. In place of the distributed line, therefore, the used circuitry is arranged so that a spiral inductor of a lumped constant is attached to the outside of the substrate. Nevertheless, as described in this publication, the chip size is as large as 2.7 mm×2.7 mm. The circuitry described in page 2-612 of 1994 Spring Meeting C-110 of IEIC is arranged so that the output matching circuit at the final stage is made of a distributed line formed on another substrate having a high dielectric constant rather than the semiconductor substrate having the FETs formed thereon.

SUMMARY OF THE INVENTION

According to the survey of the present inventors, a microwave power amplifier by the prior art for a relatively low frequency band such as several GHz used for a mobile terminal in which a spiral inductor of a lumped constant is used for supplying a drain voltage for the final-stage FET and is attached outside of the substrate, a series parasitic resistance contained in the spiral inductance brings about a voltage drop, thereby lowering the output power and the electric power gain accordingly. In addition, the circuit attached outside of the substrate enlarges the overall size of the power amplifier by the area of the outside circuit. Moreover, a multi-chip arrangement may be used wherein the output matching circuit at the final stage is formed of the distributed line on another substrate having a high dielectric constant rather than the semiconductor substrate having the FETs formed thereon. The multi-chip arrangement, however, may disadvantageously enlarge the overall area of the power amplifier.

According to one aspect of the present invention, a microwave multi-stage power amplifier has matching circuits for input and output stages and one or more inter-stage matching circuits. The amplifier and a signal output pad and first and second voltage supply pads are formed at one and the same semi-insulating substrate. A first FET in the output stage has its drain connected to the first voltage supply pad through a first distributed line and further connected to the signal output pad through a second distributed line in which the first and second distributed lines contribute to formation of the matching circuit for the output stage. A second FET in a stage preceding to the output stage has its drain connected to the second voltage supply pad through a third distributed line serving as a connection conductor. The first distributed line has a width larger than that of the third distributed line and has a length which limits an impedance seen at the drain of the output stage FET towards the first voltage supply pad at an operation frequency of the amplifier to a value other than infinity.

According to another aspect of the present invention, a small and high-performance microwave monolithic IC power amplifier is provided in which a matching/power supply distributed line is used for supplying a drain voltage for an FET at the output stage, whereby all the matching circuits are formed on one and the same small and semi-insulating substrate along with the FETs.

In the matching circuit at the output stage of a multi-stage power amplifier, in place of the conventional technical concept in which a line length of a matching/power supply distributed line at the output stage is set to $\lambda/4$ ($\lambda$: effective wavelength at an operation frequency of the amplifier) to make an impedance seen at the drain (electrode) towards the power supply infinity, a novel technical concept is introduced in which a ratio of an output impedance of the FET at an output stage to an impedance seen at the drain (electrode) of the FET at the output stage towards the power supply (drain voltage supply pad) is other than infinity such that the above-mentioned impedance ratio may be, for example, about 100 times. This novel technical concept contributes to reduction of a line length of the matching/power supply distributed line for the FET at the output stage to about $1/5$ of the conventional line length $\lambda/4$ and makes it possible to form all the matching circuits for the amplifier on one and the same small and semi-insulating substrate along with FETs including the output stage FET.

In an embodiment of the present invention, a matching/power supply distributed line for the output stage FET has a larger line width than a distributed line serving as a connection conductor connected to a spiral line forming a predetermined inductance and used for supplying a drain voltage of an FET preceding to the output stage. This wider line has an increased section to reduce its parasitic resistance, which prevents a supply voltage from being lowered. Hence, the power amplifier according to this embodiment may offer a larger output electric power with high performance. Further, the matching/power supply distributed line for the output stage FET has a line length of $\lambda/4$ ($\lambda$: effective wavelength at the operation frequency of the amplifier) according to the conventional established design concept, in which an impedance seen at the drain (electrode) of the FET toward the power supply stage becomes infinity and a ratio of the output impedance of the FET to that impedance is made closer to infinity. However, noting that the output impedance of the FET at the output stage is as small as about 1 $\Omega$ in the frequency band of 1.9 GHz, according to the teaching of the present invention, the impedance seen at the drain (electrode) of the FET towards the power supply (drain voltage supply pad) may be, for example, about 100 $\Omega$ with the line length that is about $1/5$ time as short as the conventional line length, so that the ratio of the output impedance of the FET to that impedance may be about 100. This figure indicates the leakage of an output signal to the power supply is negligible. This ratio may be variable according to a requirement specification for the power amplifier. When this ratio is 100, the degree of leakage of the signal supplied from the FET at the output stage to the drain voltage supply pad (power supply) is suppressed to be 2% or less.

As is understood from the foregoing functions, the connection conductor for supplying a drain voltage of the FET at the output stage is allowed to be made of the distributed line and formed on the substrate. Hence, all the matching circuits included in the power amplifier are formed on one and the same small and semi-insulating substrate with the FETs. As such, the foregoing arrangement makes it possible to implement a small and high-performance microwave monolithic IC power amplifier.

DESCRIPTION OF THE PREFERRED EMBODIMENTS

The description will be made of embodiments of the present invention with reference to FIGS. 1 to 3.

Figure 1:
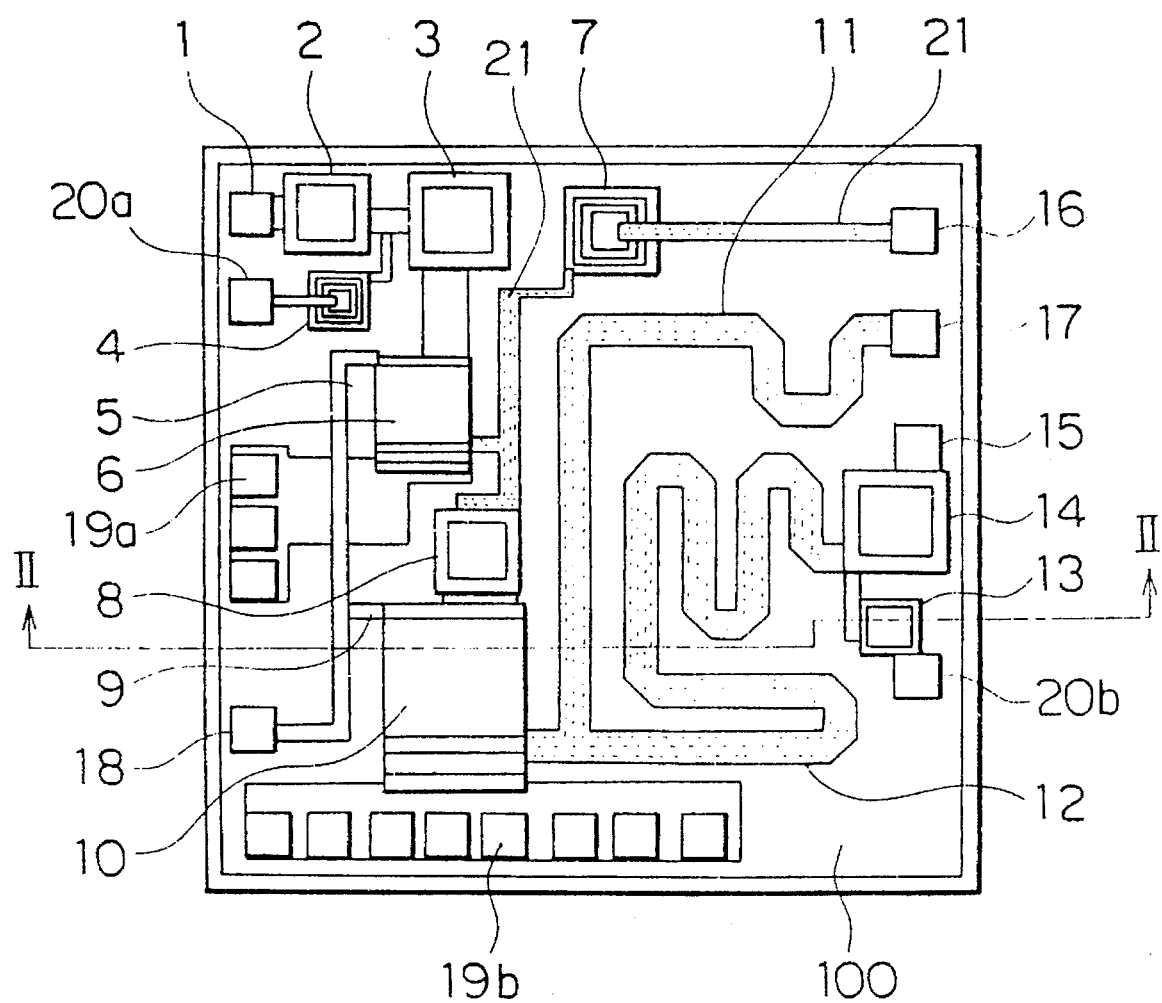
FIG. 1 is a plan pattern view showing a monolithic semiconductor integrated circuit device including a microwave multi-stage power amplifier according to an embodiment of the present invention.
Figure 2:
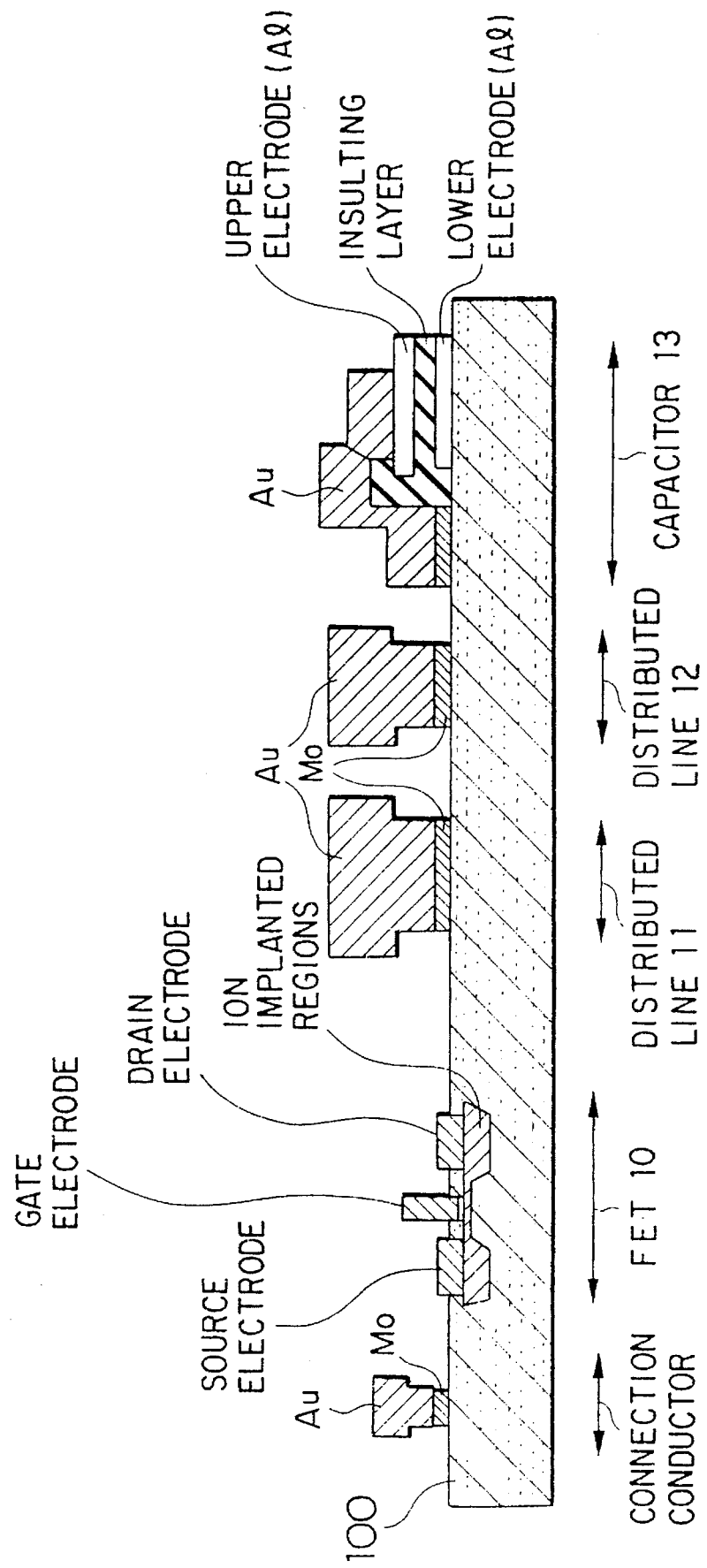
FIG. 2 is a section taken along line II—II in FIG. 1.

FIG. 1 is a diagram showing an upper surface pattern of a monolithic integrated circuit device according to an embodiment of the present invention. This circuit device includes a microwave multi-stage power amplifier, a signal input pad 1, voltage supply pads 16 and 17, a signal output pad 15, grounding pads 18, 19a, 19b, 20a and 20b, which are formed on or in surface portions of a semi-insulating substrate 100 made of GaAs, for example.

Figure 3:
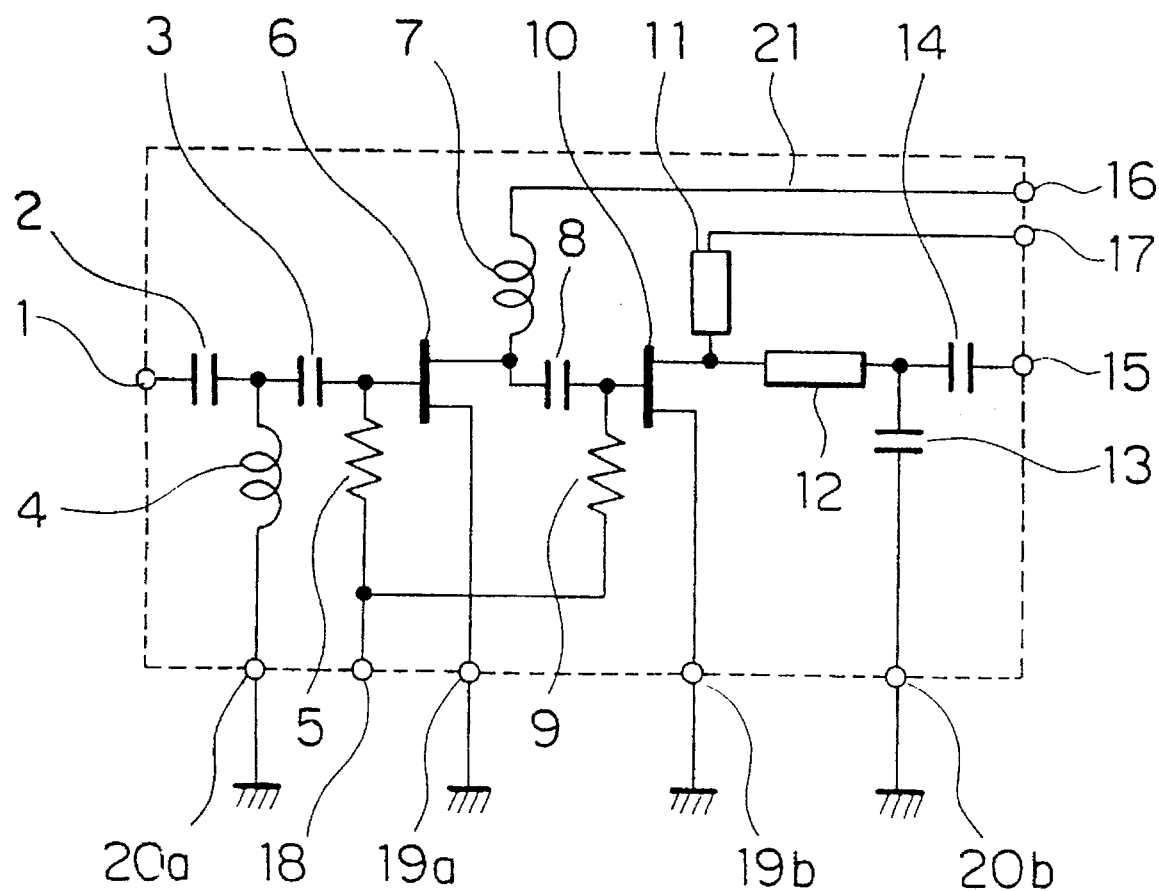
FIG. 3 is a circuit diagram showing an equivalent circuit to the power amplifier shown in FIG. 1.

As is best understood from FIG. 3, the multi-stage power amplifier includes a first stage (input stage) having an FET 6 whose source is connected to the grounding pad 19a, an input stage matching circuit having capacitors 2 and 3, a spiral inductor 4 (lumped constant element) and a resistor 5 and located between the signal input pad 1 and a gate of the FET 6, a second stage (output stage) having an FET 10 whose source is connected to the grounding pad 19b, an inter-stage matching circuit having a spiral inductor 7 (lumped constant element), a capacitor 8 and a resistor 9 and located between the first stage and the second stage, more particularly, a drain of the FET 6 of the first stage and a gate of the FET 10 of the second stage, and an output stage matching circuit having distributed lines 11, 12 and capacitors 13, 14, the circuit being provided at the drain of the FET 10 of the output stage.

In the input stage matching circuit, the capacitors 2 and 3 are connected in series between the signal input pad 1 and the FET 6. The spiral inductor 4 is connected between the grounding pad 20a and the junction between the capacitors 2 and 3. The resistor 5 is connected between the grounding pad 18 and the junction between the capacitor 3 and the FET 6. In the inter-stage matching circuit, the spiral inductor 7 is connected between the drain of the FET 6 and the voltage supply pad 16. The capacitor 8 is connected between the drain of the FET 6 and the gate of the FET 10. The resistor 9 is connected between a gate of the FET 10 and the grounding pad 18. In the output stage matching circuit, the distributed line 11 is connected between the drain of the FET 10 and the voltage supply pad 17. The distributed line 12 and the capacitor 14 are connected in series between the drain of the FET 10 and the signal output pad 15. The capacitor 13 is connected between the grounding pad 20b and the junction between the distributed line 12 and the capacitor 14. The power amplifier in the illustrated monolithic integrated circuit device may be used for a sending unit of a mobile communication terminal.

Referring again to FIG. 1, in the inter-stage matching circuit, the spiral inductor 7 has a width of 6 μm and a space of 16 μm between adjacent spiral turns. Further, the spiral inductor 7 has a parasitic resistance of about 2 Ω. The electric connections between the spiral inductor 7 and the FET 6 and between the spiral inductor 7 and the voltage supply pad 16 are achieved by the distributed line 21 only serving as a connection conductor. The distributed line 21 is not intended to contribute to determination of electric characteristics of the inter-stage matching circuit. The distributed line 21 may have a laminated structure having a molybdenum (Mo) film formed on the substrate 100 and a gold (Au) film formed on the Mo film. The width of the laminated structure may be about 25 μm.

The current to be supplied to the drain of the FET 6 in the first stage is as small as about 40 mA. Hence, the spiral inductor 7 having a parasitic resistor of about 2 Ω may bring about as small a voltage drop as about 0.08 V. Thus, the output signal supplied from the FET 6 to the output stage only suffers a drop negligibly small.

In the output stage matching circuit, the distributed line 11 located between the drain of the FET 10 and the drain voltage supply pad 17 serves to supply such a large current as about 240 mA to the FET 10. If, therefore, the line 11 has the same width as the line 21, the line 11 will bring about a voltage drop of about 0.5 V, which is significantly large in view of the supply voltage of 3.0 V, namely, the output signal level of the line 11 will be remarkably lowered. To avoid this problem, the line 11 is formed to have a width larger than that of the distributed line 21, for example, about 72 μm. The length the line 11 may be about 1.5 mm. Since the output impedance of the FET 10 is as small as about 1 Ω, with the length of the line being about 1.5 mm, that is, about ⅕ or less of about 11 mm corresponding to a value of λ/4 according to the conventional design, a ratio of the output impedance of the FET 10 to the impedance appearing at the operation frequency of the amplifier and seen at the drain of the FET 10 towards the power supply (the voltage supply pad 17) will be about 100. A leakage of the output signal from the output stage to the power supply is made negligibly small even with such a shortened distributed line 11. That is, at the operation frequency of the power amplifier, against the conventional design concept, the impedance seen at the drain of the FET 10 towards the voltage supply pad 17 is limited to a finite value other than infinity. This design according to the novel technical concept allows the distributed line 11 to be formed on (accommodated in) the substrate 100. The line 11 may be meandering, if necessary. Further, since the line width of the distributed line 11 is as large as 72 μm, the parasitic resistance of the line 11 will be as small as 0.1 Ω, so that when large current of 240 mA flows through the line 11, a resulting voltage drop will be a negligibly small value, i.e., 0.024 V. This indicates that the output signal level is kept almost constant and thus a high-performance amplifier will be realized with the above-described structure. The distributed line 12, which is located between the drain of the FET 10 and the capacitor 14 connected to the signal output pad 15, is formed to have a line width of about 50 μm that is larger than that of the line 21, too. The line 12 is formed to meet the matching condition that the impedance seen at the signal output pad 15 towards the amplifier IC is 50 Ω. The line 12 has a length of about 2.5 mm to provide an optimum load at the drain of the output stage FET 10 in cooperation with the capacitors 13 and 15. The line 12 is meandering so that it may be formed on one and the same substrate. The width of the line 12 may be smaller than that of the line 11. With the foregoing structure, a high-performance microwave monolithic IC power amplifier is provided having a small chip area of 1.5 mm×1.5 mm. As schematically shown in FIG. 2, the distributed lines 11 and 12 are in a laminated structure having an Au film formed on the substrate 100 and an Mo film formed on the Au film.

The width of each of the distributed lines 21, 11, 12 referred to above means the width of that portion of the line which is in contact with the semi-insulating substrate 100.

In the foregoing embodiment, since the distributed lines are formed to have short line lengths, all the matching circuits are allowed to be formed on one and the same substrate along with FETs, which makes it possible to suppress a supply voltage drop and the output power drop. Hence, this embodiment realizes a small-sized high-performance microwave monolithic IC power amplifier.

What is claimed is:

1. A monolithic integrated circuit device having a semi-insulating substrate, a microwave multi-stage power amplifier formed at said substrate and a signal output pad and first and second voltage supply pads formed on said substrate, said multi-stage amplifier including a first stage having a first field-effect transistor, FET, and serving to deliver an output of said amplifier, a second stage having a second field-effect transistor, FET, and preceding to said first stage, a first matching circuit connected to said first FET and a second matching circuit interconnected between said first and second stages, wherein:

said first FET in said first stage has its drain connected to said first voltage supply pad through a first distributed line and further connected to said signal output pad through a second distributed line, said first and second distributed lines contributing to formation of said first matching circuit;

said second FET in said second stage has its drain connected to said second voltage supply pad through a spiral inductor and a third distributed line connected in series to said spiral inductor, said spiral inductor contributing to formation of said second matching circuit while said third distributed line serves as a connection conductor without contributing to formation of said second matching circuit; and said first distributed line has a width larger than that of said third distributed line and has a length which limits an impedance seen at said drain of said first FET towards said first voltage supply pad at an operation frequency of said amplifier to a value other than infinity.

2. A monolithic integrated circuit device according to claim 1, wherein said second distributed line has a width larger than that of said third distributed line and smaller than that of said first distributed line.

3. A monolithic integrated circuit device according to claim 1, wherein said semi-insulating substrate is made of GaAs.

4. A monolithic integrated circuit device according to claim 1, wherein each of said first, second and third distributed lines is in a laminated structure having a molybdenum film formed on said substrate and a gold film formed on said molybdenum film.

5. A monolithic integrated circuit device according to claim 1, wherein said first distributed line is meandering on said substrate.

* * * * *